United States Patent [19]
Wong et al.

[11] Patent Number: 5,121,186
[45] Date of Patent: Jun. 9, 1992

[54] INTEGRATED CIRCUIT DEVICE HAVING IMPROVED JUNCTION CONNECTIONS

[75] Inventors: Siu-Weng S. Wong, Ithaca, N.Y.; Devereaux C. Chen, San Jose; Kuang-Yi Chiu, Los Altos Hills, both of Calif.

[73] Assignee: Hewlett-Packard Company, Palo Alto, Calif.

[21] Appl. No.: 601,037

[22] Filed: Oct. 23, 1990

Related U.S. Application Data

[60] Continuation of Ser. No. 268,395, Jan. 8, 1989, abandoned, which is a division of Ser. No. 922,608, Oct. 24, 1986, abandoned, which is a continuation-in-part of Ser. No. 621,285, Jun. 15, 1984, abandoned.

[51] Int. Cl.$^5$ .................. H01L 29/54; H01L 23/50
[52] U.S. Cl. ..................... 357/71; 357/67; 357/42
[58] Field of Search .................. 357/71, 42, 67

[56] References Cited

U.S. PATENT DOCUMENTS

| | | | |
|---|---|---|---|
| 4,102,733 | 7/1978 | De LaMoneda et al. | 357/59 |
| 4,180,596 | 12/1979 | Crowder | 357/71 |
| 4,233,672 | 11/1980 | Suzuki | 357/42 |
| 4,319,395 | 3/1982 | Lund et al. | 357/42 |
| 4,374,700 | 2/1983 | Scott et al. | 357/59 |
| 4,392,150 | 7/1983 | Courreges | 357/71 |
| 4,443,930 | 4/1984 | Hwang et al. | 357/71 |
| 4,458,410 | 7/1984 | Sugaki et al. | 357/71 |
| 4,519,126 | 5/1985 | Hsu | 357/42 |
| 4,569,122 | 2/1986 | Chan | 357/71 |

OTHER PUBLICATIONS

Shya P. Murarka, David B. Fraser, Ashok K. Sinha, and H. L. Levinstein, "Refractory Silices of Titanium and Tantalum for Low-Resistivity Gates and Interconnects", IEEE Journal of Solid-State Circuits, vol. Sc. 18, No. 4, Aug. 1980.

R. J. Schutz and L. R. Testardi, "Thin-Film Mo-Si Interaction", Appl. Phys. Lett. 34(11), Jun. 1979.

"OHMIC Contactx for Small, Shallow Structure Devices", IBM Technical Disclosure Bulletin, vol. 22, No. 4, Sep. 1979.

S. P. Muraka, "Refractory Silicides for Integrated Circuits,", S. P. Muraka, J. Vac., Sci. Technol, q7(4), Jul.-?Aug. 1980.

*Primary Examiner*—Jerome Jackson, Jr.

[57] ABSTRACT

A method for forming a contact to a selective region of an integrated circuit characterized by the steps of: forming a layer of refractory metal over and around the selected region; forming a layer of amorphous silicon over the layer of refractory metal; patterning the amorphous silicon in to an elongated strip which extends away from the selected region; annealing the integrated circuit to convert the strip of amorphous silicon into a silicide path; and removing the unreacted refractory metal. The method of the present invention can be used to extend a contact to the source, drain, or gate of a MOSFET from the top of an adjacent section of field oxide, and can also be used as a method for local interconnection of IC devices, such as CMOS devices.

10 Claims, 4 Drawing Sheets

INTEGRATED CIRCUIT DEVICE HAVING IMPROVED JUNCTION CONNECTIONS

CROSS-REFERENCES TO RELATED APPLICATIONS

This is a continuation of copending application Ser. No. 268,395, filed on Jan. 9, 1989, now abandoned. This is a division of application Ser. No. 922,608, filed Oct. 24, 1986. This is a continuation-in-part of application Ser. No. 06/621,285, filed Jun. 15, 1984, now abandoned.

BACKGROUND OF THE INVENTION

1. Field of the Invention

This invention relates generally to the production of integrated circuits, and more particularly to processes for making contacts and interconnections among integrated circuit devices.

2. Description of the Prior Art

In the prior art, individual integrated circuit devices, such as MOSFETs, are typically interconnected by the method illustrated in FIGS. 1A, 1B, and 1C. First, the MOSFETs are fabricated on a semiconductor substrate by methods well known to those skilled in the art to form the structure illustrated in FIG. 1A. Next, as seen in FIG. 1B, a passivation layer, such as phosphosilicate glass, is uniformly deposited over the MOSFETs, and contact holes are etched through the passivation layer over the sources and drains of the MOSFETs. As illustrated by FIG. 1C, a metal layer of, for example, an aluminum alloy is then deposited over the passivation layer to create contacts to the sources and drains of the MOSFETs through the contact holes.

Finally, the metal layer is patterned to correctly interconnect the various MOSFETs of the integrated circuit.

Although this prior art method is generally adequate, it becomes less so as devices are scaled down and become progressively smaller. For example, the prior art method shown in FIGS. 1A-1C is subject to lithographic misalignment and to undercutting during contact etch. In consequence, MOSFET devices require spacing between their source/drain contact holes and the edges of the polysilicon gate and field oxide. This additional spacing requirement results in wasted areas in the integrated circuit and in increased junction capacitances, and limits the density the integrated circuit. Furthermore, the spacing between a contact hole and the edge of the active device increases the contact resistance and, consequently, further degrades device performance.

Several approaches have been proposed to overcome the problems of the prior art. With MOSFET devices, one approach is to use a polysilicon layer to contact the source and drain regions in order to minimize the junction area. This approach is represented in FIG. 2. Connections between the polysilicon layer and the metal layer are then formed on the field oxide layer. The major drawback to this approach is that during the polysilicon etch, the silicon substrate is also etched inadvertently. The effective junction depth can therefore be affected and the substrate may also be damaged. Another drawback of the method illustrated in FIG. 2 is that the polysilicon layer is not a particularly good conductor and thus creates considerable resistance between the metal contacts and the source or drain regions.

The approach illustrated in FIG. 3 addresses the contact resistance problem. To reduce resistance, a refractory metal, such as titanium, can be uniformly deposited over the polysilicon and subsequently annealed to form low-resistivity silicide, and the unreacted refractory metal subsequently removed. Unfortunately, the method illustrated by the structure shown in FIG. 3 can still damage the silicon substrate during the etching of the polysilicon layer. Furthermore, since a polysilicon layer is used to contact the source and drain of the MOSFET, the method of FIG. 3 can only be used if the polysilicon is closely matched in crystal structure, polarity, and doping level to the source and drain. If the polysilicon is not closely matched, large contact resistances and parasitic diode effects can be created, possibly damaging the operation of the device.

Some attempts have been made in the prior art to use silicide as an ohmic contact. For example, Ku in the "IBM Technical Disclosure Bulletin", Vol. 22, No. 4 (September, 1979) discloses ohmic contacts for small, shallow structure devices which are made by applying a metal layer over a dielectric film, applying a polysilicon layer over the metal layer, patterning the polysilicon, and converting the patterned polysilicon to silicide by reacting it with the underlying metal layer.

A problem of Ku's method is the difficulty in forming a polysilicon layer over a metal layer. If the two layers are formed by a Low-Pressure Chemical Vapor Deposition (LPCVD) method, the LPCVD machine must be pumped down twice, i.e., once for the metal deposition, and once for the high temperature polysilicon deposition.

Furthermore, Ku does not address the problem of connecting the silicide layer to a silicon layer. Ku's silicide is formed totally over a metal layer which, in turn, is formed totally over a dielectric layer. In fact, the problem of connecting a silicide layer to a silicon layer is not well addressed in the prior art as a whole. The current state of the art only allows the connection of n-type polysilicon based silicide to n-type silicon without the aforementioned problems of high ohmic contacts and parasitic diode effects. Obviously, such silicide to silicon connects are inadequate in a p-channel MOS or CMOS environment.

SUMMARY OF THE INVENTION

An advantage of the present invention is that low-resistivity interconnects for integrated circuits may be produced without damaging the silicon substrate.

Another advantage of the present invention is that MOSFET devices can be produced with smaller source and drain regions, allowing greater integrated circuit density.

Yet another advantage of this invention is that devices can be coupled together without the need of a metal layer, and that a connection to a metal layer can be shared among several devices.

A still further advantage of this invention is that low resistivity silicide connections can be made which can contact and interconnect virtually any type of integrated circuit device.

In accordance with a method in accordance with the present invention, after MOSFETs are fabricated, oxide sidewall spacers are formed around their polysilicon gates. Next, a layer of refractory metal is uniformly deposited over the MOSFET devices, and then a layer of amorphous silicon is uniformly deposited over the amorphous silicon. The amorphous silicon layer is patterned by etching, using the refractory metal as an etch stop to prevent the inadvertent etching of the underlying silicon substrate. Next, the refractory metal layer and patterned amorphous silicon are converted to silicide by a thermal annealing process which fully consumes the amorphous silicon. The unconverted refractory metal regions are then removed, thereby creating self-aligned contacts to the source, drain, and gate areas by the silicide. A passivation layer is uniformly deposited over the silicide layer, and contact holes are formed through the passivation layer by an etching process to permit contacts between a subsequent metal layer and the silicide layer.

An advantage of the present invention is that low resistance interconnects and contacts can be provided in an uncomplicated and economical manner.

Another advantage of the present invention is that the areas of the source and drain regions of MOSFETs can be reduced in size.

A further advantage of the present invention is that a plurality of devices can be connected to a metal layer at by a single, common contact.

Yet another advantage of this invention is that the silicide layer can contact and interconnect virtually any type of integrated circuit device.

These and other objects and advantages of the present invention will be apparent to those skilled in the art after reading the following descriptions and studying the various figures of the drawing.

DETAILED DESCRIPTION OF THE PREFERRED EMBODIMENT(S)

Figure 1A:
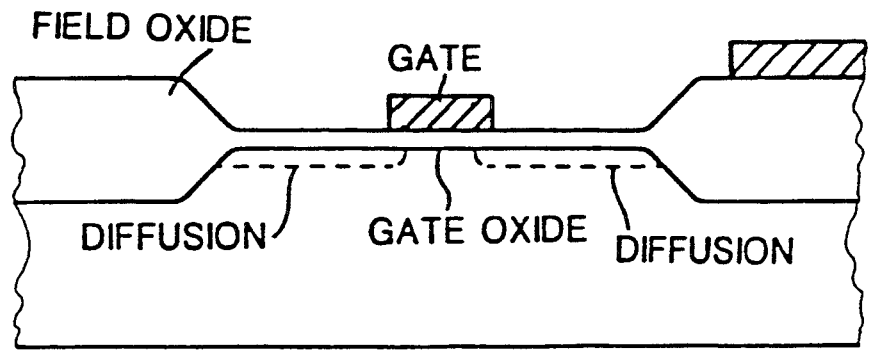
FIGS. 1A, 1B, 1C illustrate a typical prior art contact technology for MOSFETs.
Figure 1B:
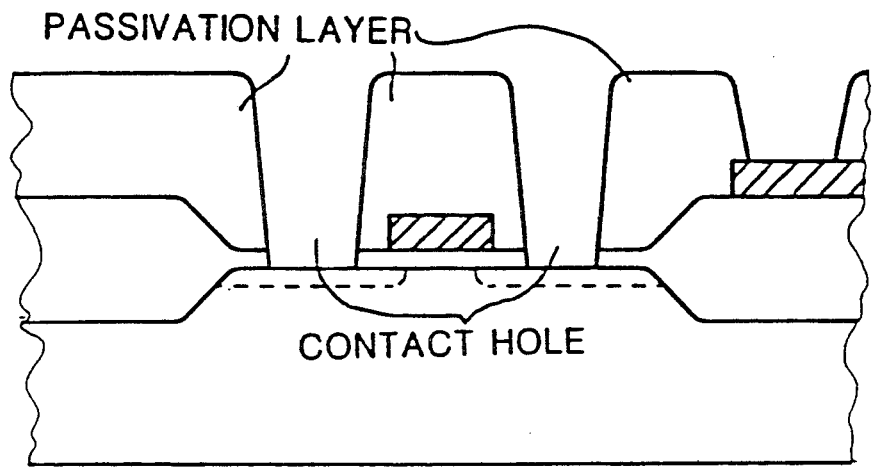
Figure 1C:
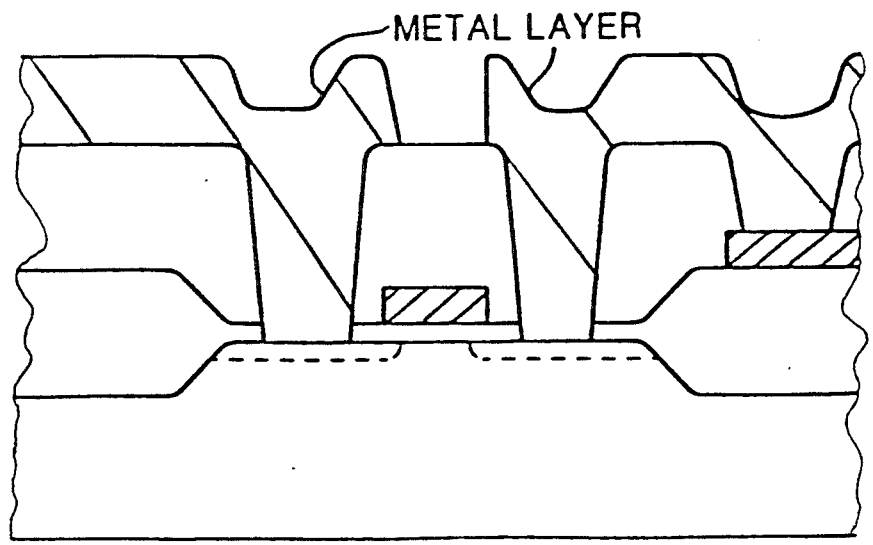
Figure 2:
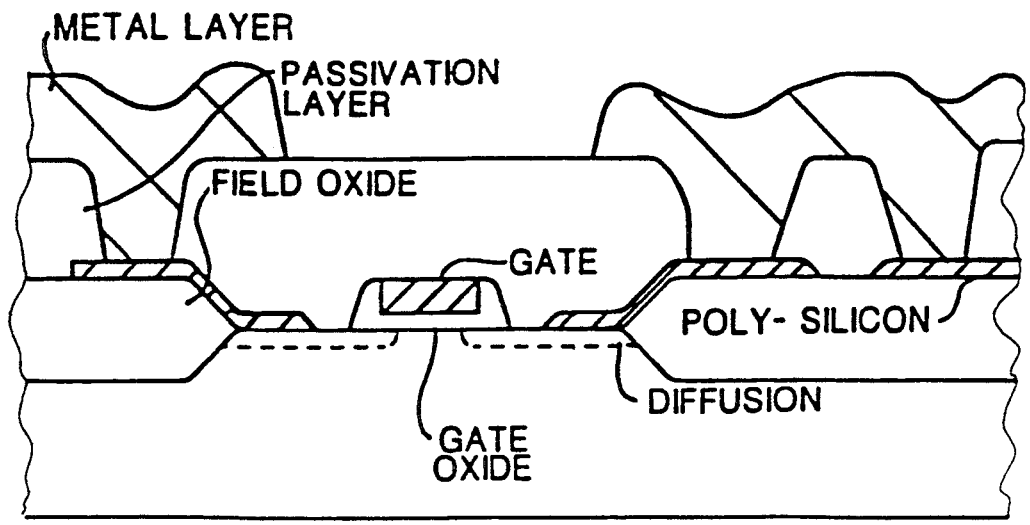
FIG. 2 illustrates an alternative prior art contact technology for MOSFETs.
Figure 3:
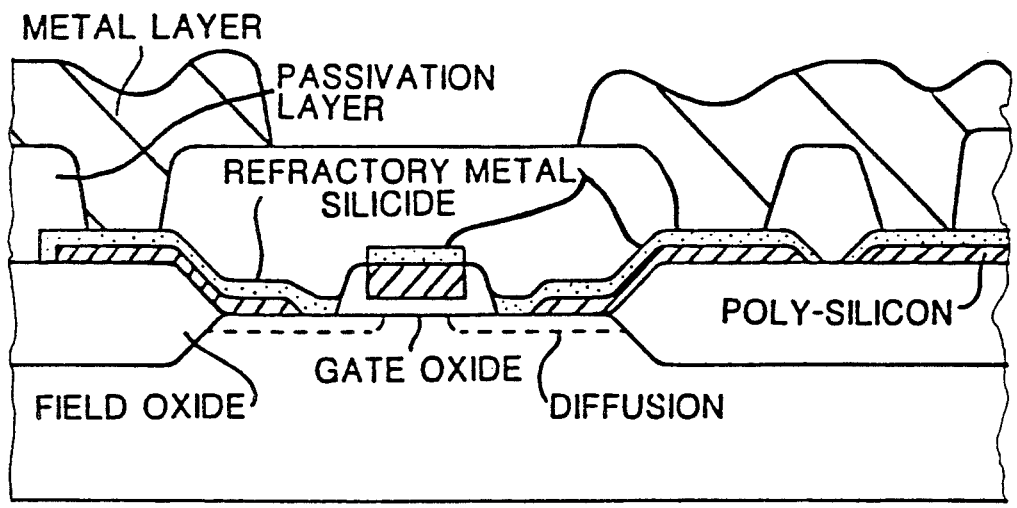
FIG. 3 illustrates a prior art contact technology for MOSFETs which is an improvement over the technology illustrated in FIG. 2.
Figure 4A:
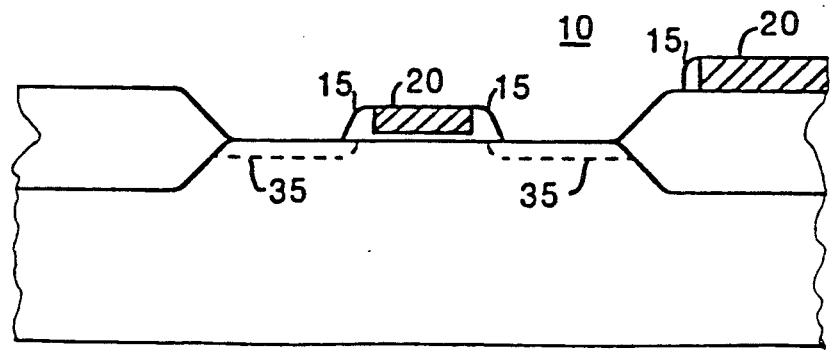
FIGS. 4A, 4B, 4C, and 4D illustrate a process in accordance with the present invention for making contacts to MOSFET devices.
Figure 4B:
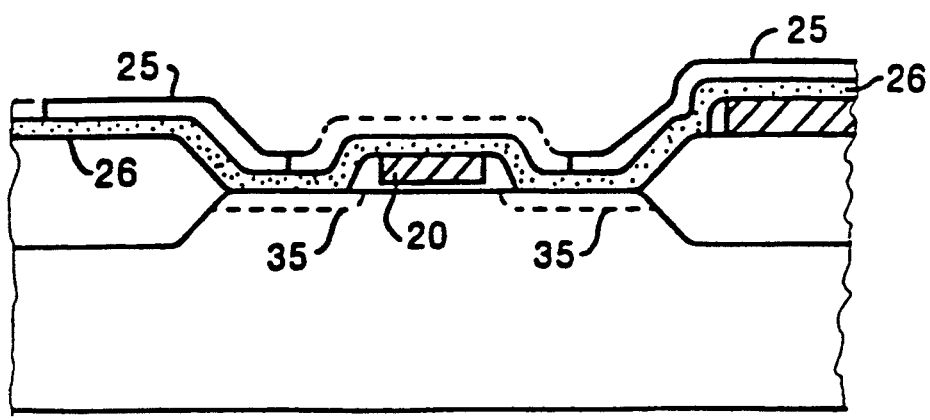
Figure 4C:
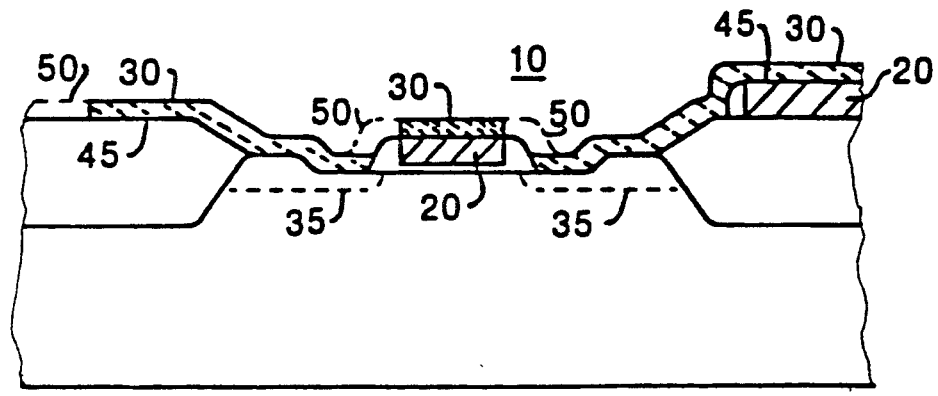
Figure 4D:
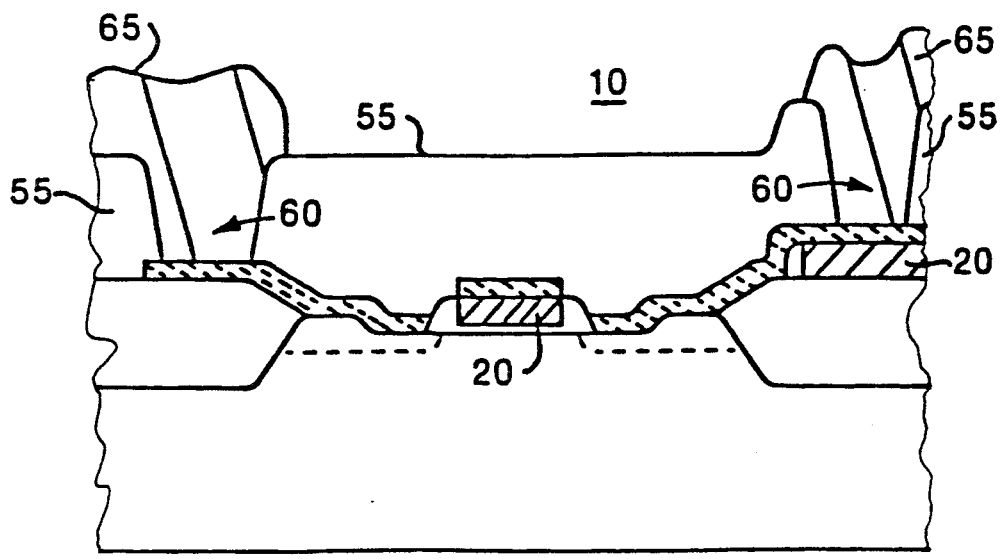

In accordance with the present invention, an integrated circuit device 10, for example, a MOSFET device, is fabricated by a prior art method. Oxide wall spacers 15 are next formed against a polysilicon gate 20. These spacers 15 can be formed by anisotropic etching of a uniform layer of chemical-vapor-deposited (CVD) silicon dioxide. Next, a composite layer of amorphous silicon 25 on refractory metal 26 is sputter-deposited over the device, including the spacers 15.

More specifically, the refractory metal 26 is first uniformly deposited over the device, and then the amorphous silicon 25 is uniformly deposited over the refractory metal 26. The deposition of first the metal 26 and then the silicon 25 can be accomplished during a single pump down cycle in a sputtering system by providing both a metal target and a silicon target within the sputtering machine.

Next, with the aid of a mask (not shown), the amorphous silicon 25 is etched into a preselected pattern. The underlying refractory metal layer 26 serves as an effective etch stop during this patterning process, preventing damage to the underlying substrate. Furthermore, the amorphous silicon layer 25 is completely isolated from the underlying substrate by the metal layer 26 to prevent possible crystalline growth to the substrate.

After the patterning, the device 10 is subjected to a thermal annealing cycle to form refractory metal silicide 30 directly contacting source and drain regions 35 and a gate region 20 of the device 10 as well as other regions 45 underneath the patterned amorphous polysilicon layer. Regions 50 of unreacted refractory metal are then selectively removed. If the refractory metal is titanium, for example, it can be removed by a selective chemical etch. Finally a passivation layer 55 is deposited, contact holes 60 between the refractory metal silicide 30 and metal 65 are defined on the passivation layer 55, and metal 65 is deposited and patterned to form contacts to the silicide layer exposed to the holes 60.

In effect, the method in accordance with the invention allows the refractory metal silicide layer 30 to form self-aligned contacts to the source and drain regions 35 and the gate region 20 of the MOSFET device. Since, in the case of a MOSFET device in accordance with the illustrated embodiment of the invention, the contacts to the source and drain regions 35 are not directly dependent on the contact holes 60 defined on the passivation layer 55 as in the prior art, the area of the source and drain regions 35 can be minimized. Junction capacitances are then reduced and denser integrated circuits are possible.

Furthermore, with the present invention, the low resistivity silicide layer can be also used to interconnect several devices and, consequently, the contact from a silicide layer to the metal layer can be shared among a number of devices. This, in turn, reduces the number of contacts in an integrated circuit, thus leading to greater packing density and improved yield.

Figure 5:
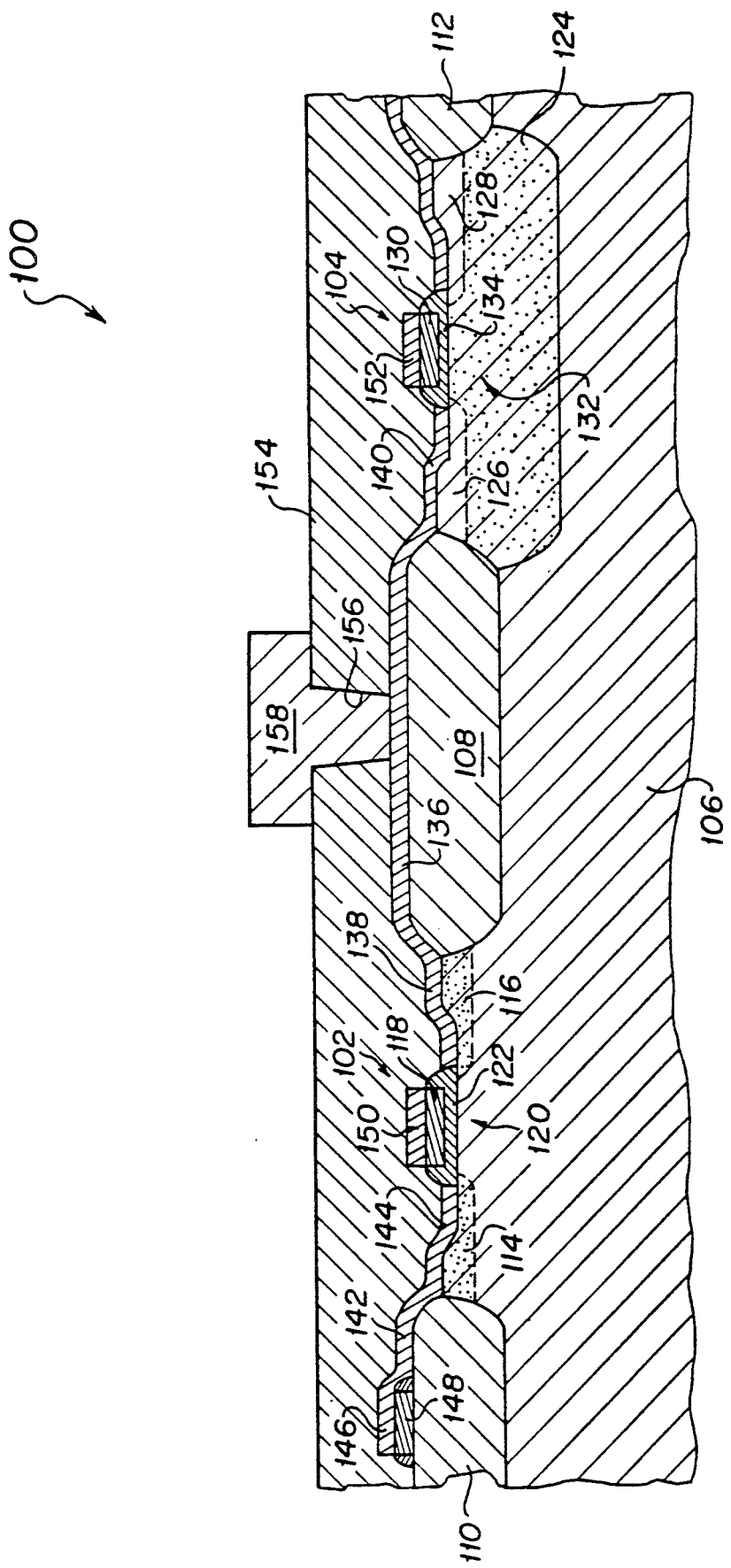
FIG. 5 illustrates a novel interconnection structure formed by the method of the present invention.

Referring now to FIG. 5, a hypothetical but illustrative integrated circuit structure 100 will be used to describe a method for local interconnection of integrated circuit devices. For example, a first device 102 and a second device 104 are formed on a semiconductor substrate 106 and are separated by a section of field oxide 108. Devices 102 and 104 are similarly isolated from other adjacent devices by other field oxide sections, such as sections 110 and 112.

If, for the sake of discussion, substrate 106 is assumed to be of a p-type material, first device 102 can represent an n-channel MOS transistor. A pair of n-doped regions 114 and 116 can serve as either source or drain, and a polysilicon gate 118 is separated from a channel region 120 by a thin oxide layer 122. The second device 104 is a p-channel MOS transistor having a structure that includes an N-type well 124, p-doped regions 126 and 128, and a polysilicon gate 130 separated from a channel region 132 by thin oxide 134.

The first IC device 102 and the second IC device 104 are shown to be locally interconnected by a conductive path 136 which extends over the section of field oxide 108. The conductive path 136 is preferably silicide formed by the previously mentioned method of this invention, but can also be a metal path such as titanium-tungsten (TiW) or titanium-nitride (TiN). The advantage of using silicide for conductive path 136 is that it is easier to etch without damage to the substrate 106.

The conductive path 136 has a first end 138 which is in contact with region 116 of device 102, and a second end 140 which is in contact with region 126 of device 104. Thus, depending upon the orientation of respective devices 102 and 104, the conductive path 136 can couple together the source and drains of MOS transistors, the sources of MOS transistors, and the drains of MOS transistors.

Also shown in FIG. 5 is a second conductive path 142 which, like conductive path 136, is preferably made from silicide, but can also be made from suitable metals or metal from alloys. If made from silicide, it can be manufactured by the aforementioned method of the present invention. Conductive path 142 has a first end 144 which contacts region 114 of device 102, and has a second end 146 which is in contact with a polysilicon gate 148 which is part of an adjacent MOS transistor (not seen). This is a particularly advantageous interconnection structure for CMOS devices because a standard CMOS cell couples the source and drain of a first pair of complementary MOS transistors to the gates of a second pair of complementary MOS transistors. It is important to note that the method for producing conductive silicide paths of the present invention can couple regions of opposite polarity types together. For example, a conductive silicide path 136 can couple an n-doped region 116 to a p-doped region 126. To accomplish this, amorphous silicon over refractory metal must be used to form the silicide, since a polysilicon based silicide would result in very high ohmic contacts and the possible formation of parasitic diodes.

As part of the process of forming the conductive paths 136 and 142, other conductive paths such as paths 150 and 152 can be formed to couple the gates 118 and 130 to other devices or to metal contacts. A passivation layer 154 made from a suitable material, such as silicon dioxide, is formed over the IC structure 100, and contact holes, such as contact hole 156, can be etched through the passivation layer 154. A metal layer 158 can then be formed and patterned to contact the conductive paths 136 over the field oxide sections 108. As mentioned previously, by forming contacts over the field oxide sections, MOSFET devices can be made smaller, increasing the density of the integrated circuit.

It should be noted that many publications describe the details of common techniques used in the fabrication process of integrated circuit components. See, for example, *Semiconductor and Integrated Circuit Fabrication Techniques*, published by Preston Publishing Co., Inc. These techniques can be generally employed in the fabrication of the structures of the present invention. Moreover, the individual manufacturing steps can be performed using commercially available integrated circuit fabrication machines. As specifically necessary to an understanding of the present invention, approximate technical data for the preferred embodiments are set forth based upon current technology. Future developments in this art may call for appropriate adjustments, as would be obvious to one skilled in the art.

While this invention has been described with reference to several preferred embodiments, it is contemplated that various alterations and permutations of the invention will become apparent to those skilled in the art upon a reading of the preceding descriptions and a study of the drawing. For example, the method in accordance with the present invention is equally applicable to both p-channel and n-channel MOSFETs. Also, extension of this self-aligned contact technology to other types of devices, such as bipolar transistors, is also possible. It is therefore intended that the scope of the present invention be determined by the following appended claims.

What is claimed is:

1. A MOSFET device comprising a substrate, two field oxide sections on the substrate; spaced-apart source and drain regions on the substrate between the oxide sections; and a metal silicide strip having an extremity embedded in and integral with one of the source and drain regions, the strip defining a conductive path between said region and a contact location of an adjacent one of the oxide sections, the strip being deposited directly on, and in intimate physical contact with said region and said oxide section for substantially the entire length of the strip from said extremity to said contact location.

2. A MOSFET device according to claim 1 wherein the metal silicide strip comprises a refractory metal and amorphous silicon.

3. A MOSFET device according to claim 1 wherein the field oxide sections are elevated above the substrate.

4. An integrated circuit comprising:
 a substrate including two device areas and a field oxide section therebetween;
 in one device area, a drain region adjacent the oxide section;
 in the other device area, a source region adjacent the oxide section; and
 a metal silicide, strip having a first extremity embedded in and integral with the drain region and extending from the drain region across the oxide section to the source region and having a second extremity embedded in the integral with the source region, the strip being deposited directly on, and in intimate physical contact with, the regions and the oxide section for substantially the entire length of the strip between said extremities and operative to establish an electrically conductive path between the source and drain regions.

5. An integrated circuit according to claim 4 wherein the metal silicide strip comprises a refractory metal and amorphous silicon.

6. An integrated circuit according to claim 4 wherein the field oxide section is elevated above the substrate.

7. An integrated circuit according to claim 4 wherein one of the source and drain regions is N-doped and the other is P-doped.

8. An integrated circuit comprising:
 a substrate including a plurality of device areas separated from each other by field oxide sections, each device area having a source region and a drain region and a gate therebetween; and
 a metal silicide strip having an extremity embedded in and integral with one of the source and drain regions of one of the devices, the strip extending from said region across an adjacent oxide section to a gate of another device, the strip being deposited directly on, and in intimate physical contact with, said region and oxide section for substantially the entire length of the strip between said extremity and said gate and operative to establish an electrically conductive path between said region and said gate.

9. An integrated circuit according to claim 8 wherein the metal silicide strip comprises a refractory metal and amorphous silicon.

10. An integrated circuit according to claim 8 wherein the field oxide section is elevated above the substrate.

* * * * *